(12) United States Patent
Stark

(10) Patent No.: US 6,617,871 B2
(45) Date of Patent: Sep. 9, 2003

(54) METHODS AND APPARATUS FOR BI-DIRECTIONAL SIGNALING

(75) Inventor: Donald C. Stark, Los Altos Hills, CA (US)

(73) Assignee: Rambus Inc., Los Altos, CA (US)

( * ) Notice: Subject to any disclaimer, the term of this patent is extended or adjusted under 35 U.S.C. 154(b) by 0 days.

(21) Appl. No.: 09/902,278

(22) Filed: Jul. 9, 2001

(65) Prior Publication Data

US 2003/0006796 A1 Jan. 9, 2003

(51) Int. Cl.[7] ............................................. G01R 31/26
(52) U.S. Cl. ..................... 324/765; 324/329; 324/759; 370/282
(58) Field of Search ......................... 324/765, 329, 324/344, 763, 764, 759; 327/108, 170, 90, 355, 379; 326/82, 84, 86; 370/282, 288, 278, 365; 375/219, 220, 295, 358

(56) References Cited

U.S. PATENT DOCUMENTS 5,719,856 A * 2/1998 May ........................... 370/282
6,452,428 B1 * 9/2002 Mooney et al. ............. 327/108

* cited by examiner

*Primary Examiner*—Kamand Cuneo
*Assistant Examiner*—Trung Q. Nguyen
(74) *Attorney, Agent, or Firm*—Lee & Hayes, PLLC

(57) ABSTRACT

Improved methods and apparatuses are provided for conducting bi-directional signaling and testing. The outputs of at least two driver circuits are connected to a resistive network. The output signals from the driver circuits are combined through the resistive network to produce a resultant signal that is an attenuated version of at least one of the output signals. The resistive network and the driver circuits are configured such that the resultant signal is provided to an output node of the resistive network but not to an input node of the resistive network. An input/output node of an external circuit is connected to the input node of the resistive network, wherein the external circuit is configured to receive the resultant signal and output an external signal. An input node of a receiver circuit is connected to the output node of the resistive network. The resultant signal is then simultaneously provided to the external circuit and the external signal to the receiver circuit, bi-directionally through the resistive network.

18 Claims, 4 Drawing Sheets

US 6,617,871 B2

1

METHODS AND APPARATUS FOR BI-DIRECTIONAL SIGNALING

TECHNICAL FIELD

This invention relates to bi-directional signaling, and more particularly to improved methods and apparatuses for conducting and testing bi-directional signaling over a single transmission line.

BACKGROUND

In a typical integrated circuit testing configuration, test signals only travel in one direction at a given time between the tester and the integrated circuit. Such uni-directional signaling works well for integrated circuits with dedicated input or output pads/pins. However, many integrated circuits are configured with input/output (I/O) circuits that support bi-directional signaling through the same pad/pin. For example, certain memory integrated circuits include I/O circuits through which access is provided to the memory. As such, data can be written to the memory by providing (inputting) applicable signals to a pad/pin of an I/O circuit. The same pad/pin of the I/O circuit can be used to read data from the memory when the I/O circuit provides (outputs) a representative signal to the pad/pin. In certain implementations, the inputting and outputting of signals associated with the memory occur simultaneously.

Fully testing the operation of such integrated circuits can be difficult if not impossible, as the uni-directional tester will need to operatively switch the signaling direction back and forth between sending test signals to the integrated circuit and receiving test signals from the integrated circuit.

By way of example, FIG. 1 depicts a conventional uni-directional signaling testing arrangement 100 configured to support limited bi-directional signaling. Arrangement 100, in this example, includes a tester device 102 operatively coupled through a single transmission line 104 to a device under test (DUT) 106 (e.g., an integrated circuit). Here, to conduct limited bi-directional signaling over transmission line 104, tester device 102 and DUT 106 need to take turns in sending/receiving signals. Hence, this is essentially a time-multiplexed solution for conducting and testing bi-directional signaling.

As mentioned above, one of the drawbacks to testing arrangement 100 is that it is unable to conduct simultaneous bi-directional signaling. As such, DUT 106 may not be fully tested since only a portion of the operational I/O bandwidth can be tested. More specifically, the average bandwidth of transmission line 104 will be lower, because there is usually a need to pause between switching the direction of the signaling to allow the voltage in transmission line 104 to dissipate.

Hence, there is a need for arrangements that allow the full operational bandwidth to be tested.

As a basic reference, FIG. 2 depicts an exemplary receiver portion 120 of tester device 102. Here, receiver portion 120 includes a high gain comparator 122 that is configured to measure if the received signal from DUT 106 is above or below a threshold voltage level ($V_{CMP}$). Comparator 122 outputs the measured voltage level ($V_{RCV}$). Receiving circuits such as this and associated signal driving circuits are well known.

With this in mind, FIGS. 3a–b depict two common time-multiplexed testing arrangements and techniques. As shown in the example of FIG. 3a, tester device 102 includes

2 a receiver portion represented by comparator 122, and a driver portion represented by operational amplifier 124. These portions are operatively configured to time-share transmission line 104. Here, since both the receiver and driver portions utilize the same transmission line 104, there is a need to pause transmissions when switching to allow earlier signals to propagate.

FIG. 3b depicts a slightly improved testing arrangement, wherein dual transmission lines are provided. Here, transmission line 104a is configured to carry signals from operational amplifier 124 to DUT 106; transmission line 104b is configured to carry signals from DUT 106 to comparator 122. Because of the separate transmission lines, there is no need to wait as long for propagation delays when switching between receiver and driver portions. While this reduces the turn around time delays, the performance of the DUT cannot be fully tested, because the transmission sequence still needs to be reversed (i.e. simultaneous bi-directional signaling is not supported).

There are some test circuits that allow for simultaneous bi-directional signaling. However, such circuits are configured for use with specific devices, such as telephone devices. By way of example, FIG. 4 depicts an exemplary arrangement for providing bi-directional signaling over two transmission lines 126. As shown, this arrangement includes similarly configured transceivers (identified as Transceiver A and Transceiver B) coupled together through transmission lines 126. Since this arrangement is common to telephony, the transmission lines are usually implemented using twisted pair wires. Although detailed analysis of this well known arrangement is beyond the scope of this document, a brief conceptual description is provided below. Readers seeking additional information are directed, for example, to a text by William J. Dally and John W. Poulton, *Digital Systems Engineering*, Section 8.3, published by Cambridge University Press, March 1998.

Conceptually, the arrangement in FIG. 4 is fairly simple in operation in that each transceiver is configured to subtract its outgoing signal from the incoming signal before sampling the data. Here, for example, in Transceiver A forward voltage $V_{f1}$ (which includes transmitted data $D_{TA}$) is subtracted from received voltage $V_{LA}$ using a comparator to produce received data $D_{RA}$. Note, that both transceivers require $V_{L(A,B)}$ and $V_T$ (a threshold voltage) as carried through transmission lines 126.

Ensuring that a DUT having only has a single I/O pad/pin works correctly is less straightforward. The pin electronics in most conventional semiconductor testing equipment (e.g., automated testing equipment (ATE)) can only be configured to receive or transmit data at a given time, because the test equipment receiver lacks the second externally accessible port used to cancel any outgoing signal that is applied to the DUT (i.e., as in the exemplary arrangement in FIG. 4). As such, the standard configurations for testing I/O connections are unable to test simultaneous I/O because the tester driver will interfere with data seen at the tester receiver. One possible solution to this problem would be to redesign the tester. This would likely be a very expensive engineering endeavor, since testers tend to be very precise and carefully engineered devices; for example, an average semiconductor ATE device can cost in excess of one million dollars.

Consequently, there is a need for improved methods and apparatuses for conducting bi-directional signaling and testing devices that support such bi-directional signaling.

BRIEF DESCRIPTION OF THE DRAWINGS

A more complete understanding of the various methods and apparatuses of the present invention may be had by reference to the following detailed description when taken in conjunction with the accompanying drawings wherein.

DETAILED DESCRIPTION

Figure 1:
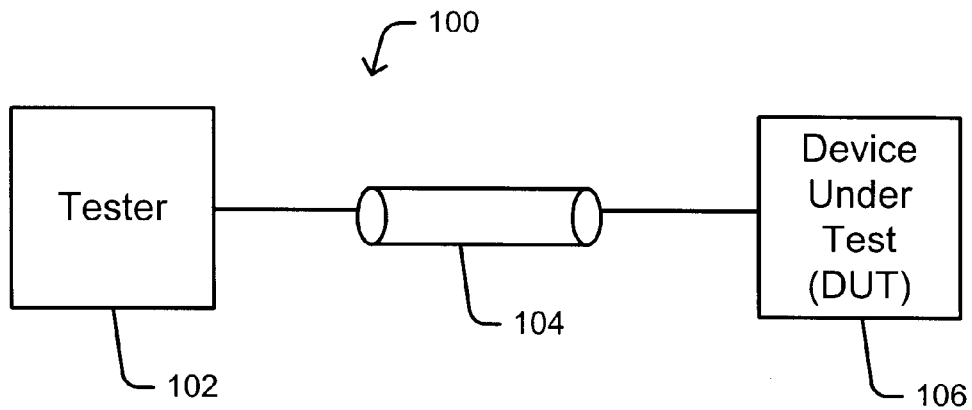
FIG. 1 is a block diagram depicting an exemplary conventional signal testing arrangement having a tester device coupled through a transmission line to a device under test (DUT).
Figure 2:
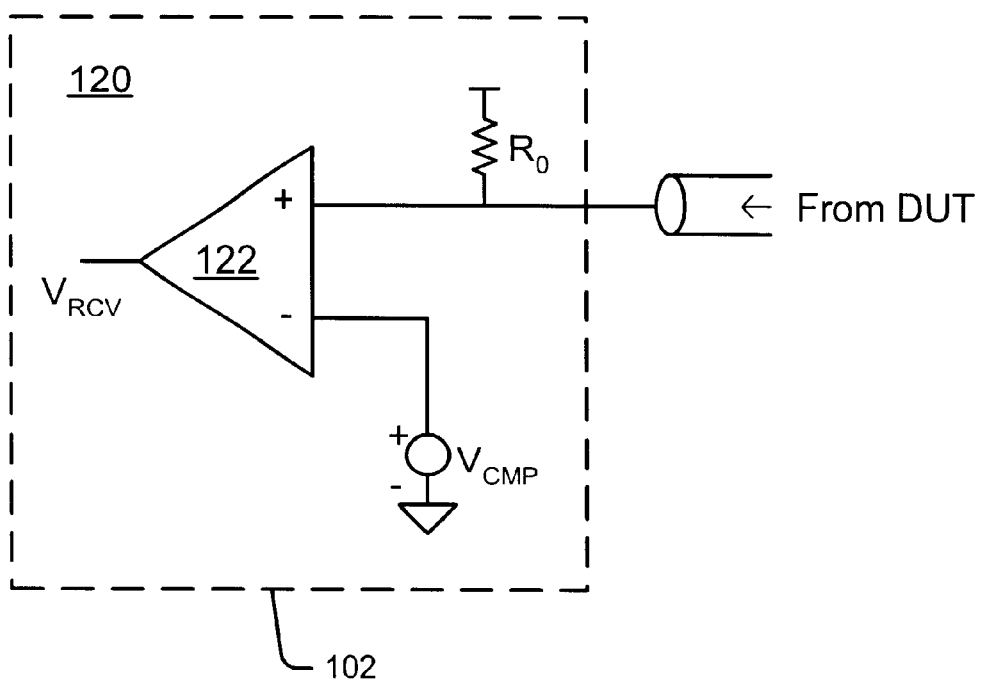
FIG. 2 is a schematic diagram depicting a portion of an exemplary prior art receiver circuit with a testing device as in FIG. 1.
Figure 3A:
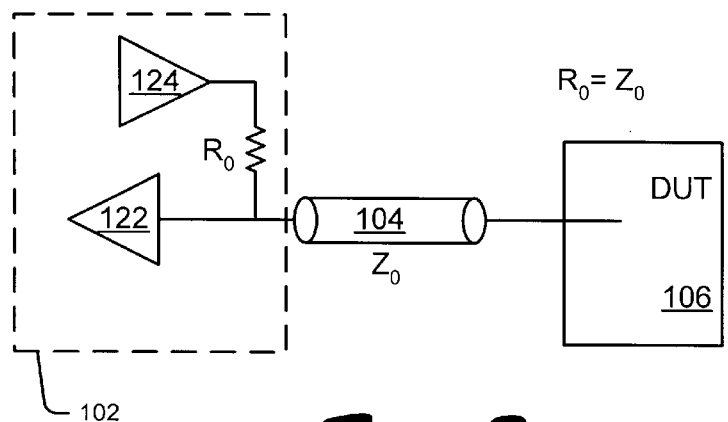
FIGS. 3a–b are partial schematic diagrams depicting two different prior art circuits and techniques for testing non-simultaneous bi-directional signaling using time-multiplexed test signals.
Figure 3B:
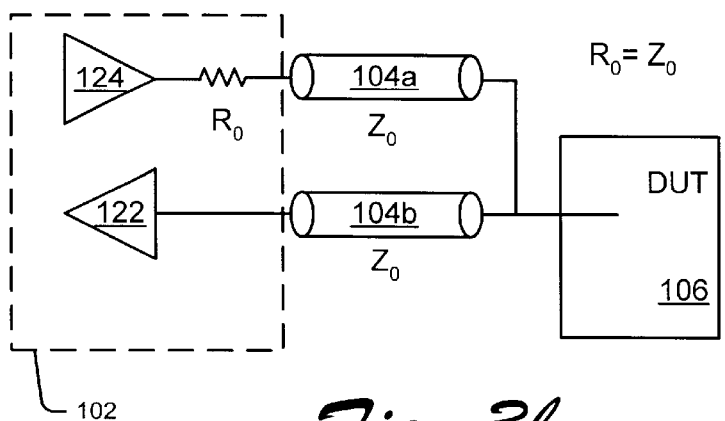
Figure 4:
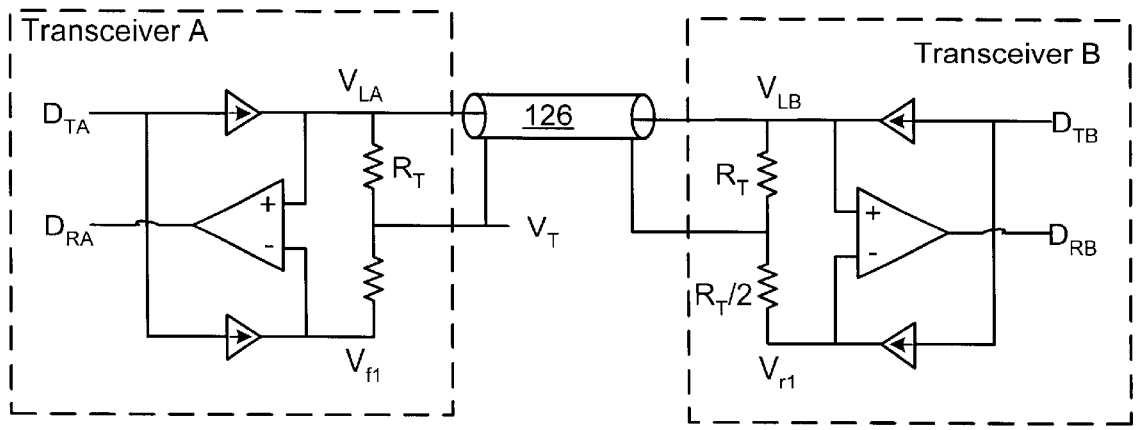
FIG. 4 is a partial schematic diagram depicting a prior art circuit and technique for simultaneously sending bi-directional signals using two transmission lines.

Tester devices, such as ATEs, tend to come with a plurality of drivers and receivers. Referring back to FIG. 1, the end user of a general-purpose tester device 102 typically couples the DUT 106 to the tester device 102 through an intervening load board (not shown) that provides the necessary circuitry to complete the transmission line 104. It is here, for example, in the load board, or other configured interconnecting circuitry, that the methods and apparatuses, in accordance with the present invention, are implementable. One possible arrangement is depicted in the exemplary implementation of FIG. 5. Those skilled in the art will further recognize that this and similar circuitry may also be incorporated into the tester device 102 itself. Moreover, the techniques taught herein may be applied to other non-test related bi-directional communicating circuits/devices. For example, the techniques may be used whenever it is necessary to interface non-simultaneous I/O circuits (e.g., dedicated drivers and receivers) with simultaneous bi-directional circuits (e.g., I/O circuits of an integrated circuits).

Figure 5:
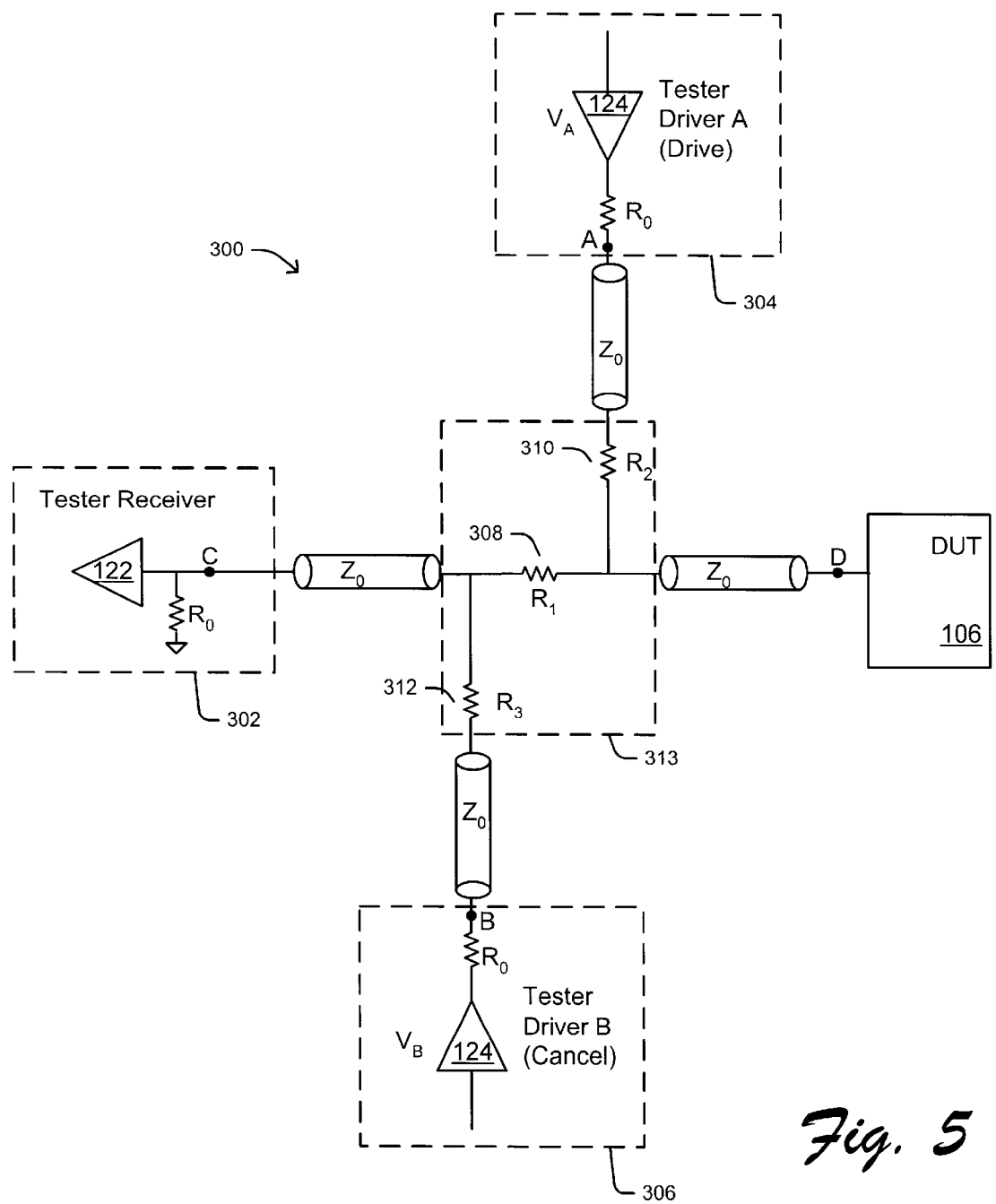
FIG. 5 is a schematic diagram depicting a novel circuit and technique for simultaneously sending and receiving bi-directional signals over a single transmission line to an I/O circuit in a DUT, in accordance with certain exemplary implementations of the present invention.

With reference to FIG. 5, an arrangement 300 is depicted for conducting and testing bi-directional signaling with a targeted device, in this example, DUT 106. In addition to DUT 106, arrangement 300 includes a tester receiver 302, two tester drivers 304 and 306, and an interconnecting arrangement of transmission lines and a matching resistor network consisting of resistors $R_1$, $R_2$ and $R_3$ (308, 310 and 312, respectively). Given this configuration, any signal that tester driver 304 outputs will be received at identified nodes C and D, but will be attenuated at node C due to resistor $R_1$ 308. Similarly, any signal that is output by tester driver 306 will also be received at nodes C and D, but will be attenuated more at node D due to resistor $R_1$ 308.

By varying the output level and subsequent attenuation of the opposing or differential signals from tester drivers 304 and 306, as received at DUT 106 (node D) and tester receiver 302 (node C), it is possible to send a non-zero signal to DUT 106 and at the same time send a substantially negligible signal to tester receiver 302 (node C).

Preferably, the signal output by tester driver 306 reduces the opposing signal output by tester driver 304 at tester receiver 302 (node C) to the point where the signal from tester driver 306 is effectively cancelled or rendered negligible. This allows signals output by DUT 106 to be received by tester receiver 302 without interference from the drivers 304 and 306. The signal ($V_A$) output by tester driver 304 will be strong enough to be received by DUT 106 (node D) despite being reduced slightly by the opposing signal ($V_B$) output by tester driver 306.

In other words, the combination of the signals from tester drivers 304 and 306 resulting from the resistor network, at the DUT 106 (node D), is going to be a signal of appropriate magnitude and other characteristics such that it mimics or otherwise matches what would be seen from a dedicated driver circuit normally used to test an input pin of DUT 106. With respect to tester receiver 302 (node C), the resistor network combines the signals from tester drivers 304 and 306 in a manner such that the resultant signal at node C is at a magnitude that is essentially negligible (e.g., within a noise level) to tester receiver 302 and does not, therefore, interfere with other signals received at node C, for example, as output by DUT 106. Note also that the signal from DUT 106 is presented with matched impedance by the resistor network such that reflections are not sent back along the transmission line.

In a particular example, tester driver 304 provides the test drive signal that is represented in the resultant signal as applied to DUT 106 (node D); conversely, tester driver 306 provides a cancel signal that, when combined through the resistor network, causes most if not all of the drive signal from tester driver 304 to be attenuated at node C.

In accordance with certain exemplary implementations, the resistive network (or another like combining circuit) is included in a load board 313 as represented by the dashed line box. Load board 313 may also include one or more transmission lines and related connectors including one or more connectors or sockets for receiving the DUT.

As illustratively depicted in exemplary arrangement 300, the transmission lines between tester receiver 302, tester drivers 304 and 306, and DUT 106 have the same impedance ($Z_0$). Consequently, to eliminate reflections tester receiver 302, tester drivers 304 and 306, and DUT 106 include impedance matching resistors ($R_0$), which match impedance ($Z_0$). Similarly, matching resistor $R_1$ (308) is configured to match impedance ($Z_0$). There are a plurality of values that can be applied to resistors $R_2$ and $R_3$ (310 and 312, respectively), based on the driver signal voltages $V_A$ and $V_B$. By way of example, in certain implementations, the following values were used:

$R_1 = Z_0$, $R_2 = R_3 = 1.4142 * Z_0$, $V_A = 5.83V$, and $V_B = -0.4142 * V_A$.

Here, for example, the resistive values of $R_2$ and $R_3$ can be selected based on two criteria. First, the values are selected such that a selected driver signal voltage $V_B$ will substantially cancel out driver signal voltage $V_A$ at node C. Secondly, the values are selected such that at least an appropriate amount of driver signal voltage $V_A$ is present at node D.

Figure 6:
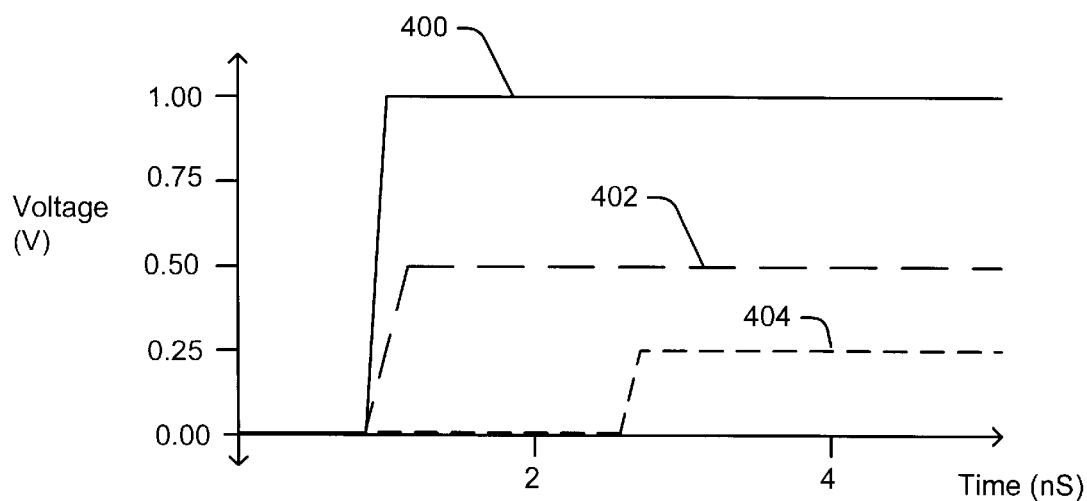
FIG. 6 is a time-line graph associated with the exemplary circuit of FIG. 5, which depicts selected voltages resulting from a signal output from the device under test (DUT).

FIG. 6 is a time-line graph associated with a SPICE simulation of exemplary arrangement 300, which depicts selected voltage levels resulting from a signal output from DUT 106. Here, the data transmission represented by line 400, begins in DUT 106 at about 1 nS with a voltage of about 1 V. This voltage is reduced by about 50% at node D, as depicted by line 402. In this example, this initial attenuation is due to source termination within the output driver of the DUT 106. After a slight propagation delay, the signal, attenuated by another 50% (resulting in about 0.25 V as represented by line 404) is received at node C in the tester receiver. As illustrated, essentially none of the signal energy is reflected back to DUT 106 from the matching network because the resistive network is configured to impedance match the transmission line between DUT 106 and the resistive network.

Figure 7:
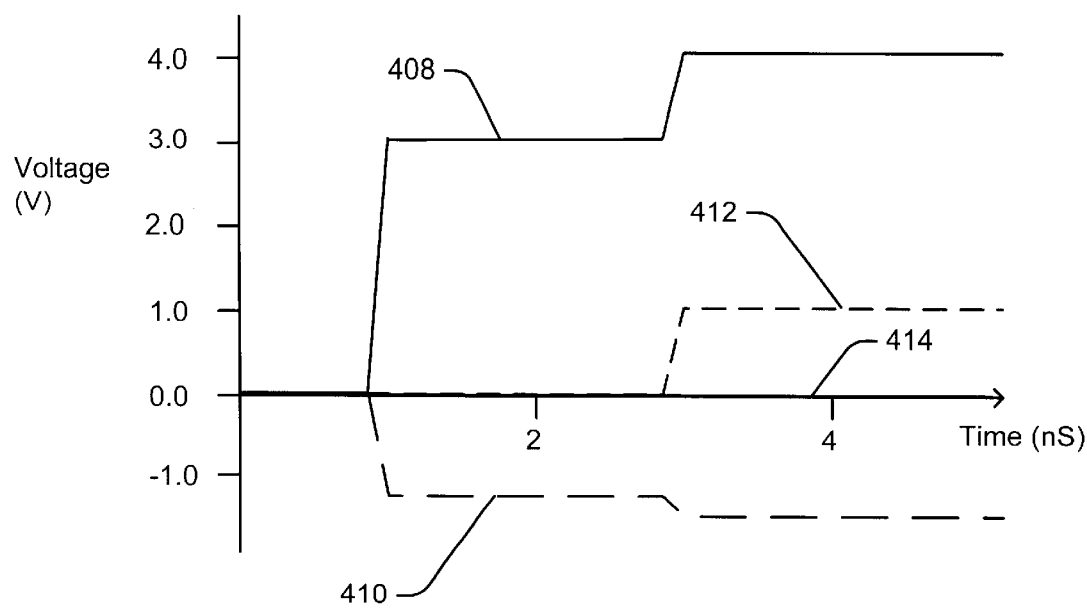
FIG. 7 is a time-line graph associated with the exemplary circuit of FIG. 5, which depicts selected voltages resulting from signals output from the tester device's test driver circuits.

FIG. 7 is also time-line graph associated with a SPICE simulation of exemplary arrangement 300, which depicts selected voltage levels resulting from signals output from tester driver 304 and tester driver 306. Here, tester driver 304 and tester driver 306 are configured to begin outputting their respective opposing signals at about 1 nS. Line 408 represents the voltage at node A, as output by tester driver 304. Line 410 represents the voltage at node B, as output by tester driver 306. Line 412 represents the voltage received at DUT 106 (node D). Here, the resulting received voltage at DUT 106 (at about 3 nS) is approximately 1.0 V as a result of the combined driver voltages (represented by lines 408 and 410) wherein the drive signal (408) is attenuated in the resistive network by the opposing cancel signal (410). Furthermore, line 414, which as shown is substantially steady at about zero volts, represents the voltage received at tester receiver 302 (node C) due to the combination of the drive and cancel signals output from tester drivers 304 and 306, respectively. Note that there may be some slight reflection back to the tester drivers.

Therefore, as shown in FIG. 7, a resultant signal derived from the signals from tester drivers 304 and 306 will be received by DUT 106 but not significantly seen at the input to comparator 122 in tester receiver 302. As shown in FIG. 6, simultaneously transmitted signals from DUT 106 will be received at comparator 122. Thus, arrangement 300 supports simultaneous bi-directional signaling and related testing.

Although some preferred implementations of the various methods and apparatuses of the present invention have been illustrated in the accompanying Drawings and described in the foregoing Detailed Description, it will be understood that the invention is not limited to the exemplary implementations disclosed, but is capable of numerous rearrangements, modifications and substitutions without departing from the spirit of the invention as set forth and defined by the following claims.

What is claimed is:

1. An apparatus comprising:
   a receiver circuit configured to receive an external signal;
   a first driver circuit configured to output a first signal;
   a second driver circuit configured to output a second signal; and
   a resistive circuit coupling the receiver circuit, first driver circuit and second driver circuit together, the resistive circuit being configured to combine the first signal and the second signal to produce a resultant signal at a first node and a substantially attenuated signal at a second node to which the receiver circuit is coupled, and wherein the attenuated signal has an amplitude within a negligible range with respect to operation of the receiver circuit.

2. The apparatus as recited in claim 1, wherein the resistive circuit including a first resistive element, a second resistive element and a third resistive element, and wherein a first transmission path including the second resistive element is coupled to the output of the first driver circuit and a first node of the first resistive element, a second transmission path including the third resistive element is coupled to the output of the second driver circuit and a second node of the first resistive element, the second node of the first resistive element is further coupled to an input node of the receiver circuit, and the first node of the first resistive element is further configurable to receive the external signal.

3. The apparatus as recited in claim 2, wherein one of the first and second signals has a positive voltage level, and wherein another of the first and second signals has a negative voltage level.

4. The apparatus as recited in claim 2, wherein at least one of the first, second and third resistive elements is a resistor.

5. The apparatus as recited in claim 2, wherein the first and second transmission paths further include first and second transmission lines, respectively, and the receiver circuit is coupled to the second node of the first resistive element through a third transmission line.

6. The apparatus as recited in claim 5, wherein each of the first, second and third transmission lines present substantially the same impedance.

7. The apparatus as recited in claim 5, further comprising a fourth transmission line having one end coupled to the first node of the first resistive element and an other end configurable to receive the external signal.

8. The apparatus as recited in claim 7, wherein each of the first, second, third, and fourth transmission lines present substantially the same impedance.

9. The apparatus as recited in claim 7, wherein the first resistive element is matched to the impedance as presented by the fourth transmission line.

10. The apparatus as recited in claim 5, wherein the receiver circuit is impedance matched to the third transmission line, first driver circuit is impedance matched to the first transmission line, and second driver circuit is impedance matched to the second transmission line.

11. The apparatus as recited in claim 1, wherein the resultant signal at the first node is provided to a device under test (DUT) that is coupled to the first node, the DUT being configured to further provide the external signal to the receiver circuit.

12. The apparatus as recited in claim 11, wherein the external signal experiences a generally matched impedance path when provided to the receiver circuit from the DUT.

13. The apparatus as recited in claim 1, wherein the receiver circuit, first driver circuit and second driver circuit are provided within an automated test equipment (ATE) device.

14. The apparatus as recited in claim 1, wherein the resistive circuit is provided within a load board.

15. A system comprising:
   a device configured to simultaneously output an external signal and input a resultant signal;
   a receiver circuit configured to receive the external signal;
   a first driver circuit configured to output a first signal;
   a second driver circuit configured to output a second signal; and
   a resistive circuit coupling the receiver circuit, first driver circuit and second driver circuit together, the resistive circuit being configured to combine the first signal and the second signal to produce a resultant signal at a first node and a substantially attenuated signal at a second node to which the receiver circuit is coupled, and wherein the attenuated signal has an amplitude within a negligible range with respect to operation of the receiver circuit.

16. A system comprising:
- a device under test (DUT) that is configured to simultaneously output an external signal and input a resultant signal;
- a test apparatus configured to test the ability to of the DUT to support simultaneous bi-directional communication, the test apparatus comprising:
  - a receiver circuit configured to receive the external signal;
  - a first driver circuit configured to output a first signal;
  - a second driver circuit configured to output a second signal; and
  - a resistive circuit coupled to the receiver circuit, the first driver circuit, the second driver circuit, and the DUT, the resistive circuit being configured to combine the first signal and the second signal to produce the resultant signal at a first node and a substantially attenuated signal at a second node to which the receiver circuit is coupled, and wherein the attenuated signal has an amplitude within a negligible range with respect to operation of the receiver circuit.

17. A load board apparatus for use in coupling a device under test (DUT) to an automated test equipment (ATE) device, the ATE device having at least two driver circuits and at least one receiver circuit, the load board apparatus comprising:
- a combining circuit configurable to support bi-directional signaling between the DUT and the ATE device, wherein the combining circuit is configured to receive a first signal from a first driver circuit and a second signal from a second driver circuit, produce a resultant signal based on the first and second signals, and apply the resultant signal to the DUT and a substantially attenuated signal to the receiver circuit, wherein the substantially attenuated signal has an amplitude within a negligible range with respect to operation of the at least one receiver circuit.

18. A load board apparatus for use in coupling a device under test (DUT) to an automated test equipment (ATE) device, the ATE device having a first driver circuit, a second driver circuit and a receiver circuit, the load board apparatus comprising:
- an output configurable to connect to the receiver circuit of the ATE;
- a first input configurable to connect to the first driver circuit of the ATE;
- a second input configurable to connect to the second driver circuit of the ATE;
- a connector configurable to connect to the DUT; and
- a resistive circuit coupled to the output, the first input, the second input, and the connector, the resistive circuit configured to receive a first input signal from the first input and a second input signal from the second input, the resistive circuit to generate a resultant signal based on the first input signal and the second input signal, and provide the resultant signal to the connector, and wherein in generating the resultant signal the resistive circuit causes only a substantially attenuated signal to be provided to the output configurable to connect to the receiver circuit of the ATE device, wherein the attenuated signal has an amplitude within a negligible range with respect to operation of the receiver circuit.

* * * * *

UNITED STATES PATENT AND TRADEMARK OFFICE
CERTIFICATE OF CORRECTION

PATENT NO. : 6,617,871 B2
DATED : September 9, 2003
INVENTOR(S) : Stark

It is certified that error appears in the above-identified patent and that said Letters Patent is hereby corrected as shown below:

Column 6,
Line 24, delete the words "an other" between "and" and "end".
Line 24, insert the word -- another -- between "and" and "end".

Signed and Sealed this

Third Day of February, 2004

JON W. DUDAS
*Acting Director of the United States Patent and Trademark Office*